(12) United States Patent
Grimbergen

(10) Patent No.: US 8,961,804 B2
(45) Date of Patent: Feb. 24, 2015

(54) ETCH RATE DETECTION FOR PHOTOMASK ETCHING

(71) Applicant: Michael N. Grimbergen, Redwood City, CA (US)

(72) Inventor: Michael N. Grimbergen, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 207 days.

(21) Appl. No.: 13/650,930

(22) Filed: Oct. 12, 2012

(65) Prior Publication Data

US 2013/0109112 A1 May 2, 2013

Related U.S. Application Data

(60) Provisional application No. 61/551,122, filed on Oct. 25, 2011.

(51) Int. Cl.
| | |
|---|---|
| *G01L 21/30* | (2006.01) |
| *G01R 31/00* | (2006.01) |
| *H01L 21/66* | (2006.01) |
| *G03F 1/80* | (2012.01) |

(52) U.S. Cl.
CPC . *H01L 22/12* (2013.01); *G03F 1/80* (2013.01)
USPC ............................................. 216/60; 438/714

(58) Field of Classification Search
USPC .......................... 216/60; 438/714, 710; 430/5
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,834,831 A | 5/1989 | Nishizawa et al. | |
| 4,993,357 A | 2/1991 | Scholz | |
| 5,225,366 A | 7/1993 | Yoder | |
| 5,281,274 A | 1/1994 | Yoder | |
| 5,294,286 A | 3/1994 | Nishizawa et al. | |
| 5,360,738 A | 11/1994 | Jones et al. | |
| 5,374,570 A | 12/1994 | Nasu et al. | |
| 5,441,703 A | 8/1995 | Jurgensen | |
| 5,443,647 A | 8/1995 | Aucoin et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,674,786 A | 10/1997 | Turner et al. | |
| 5,711,811 A | 1/1998 | Suntola et al. | |
| 5,796,116 A | 8/1998 | Nakata et al. | |
| 5,807,792 A | 9/1998 | Ilg et al. | |

(Continued)

*Primary Examiner* — Roberts Culbert
(74) *Attorney, Agent, or Firm* — Patterson & Sheridan, LLP

(57) ABSTRACT

The present invention provides a method and apparatus for etching a photomask substrate with enhanced process monitoring, for example, by providing for optical monitoring at different regions of the photomask to obtain desired etch rate or thickness loss. In one embodiment, the method includes etching a first substrate through a patterned mask layer in a plasma etch chamber, the first substrate having a backside disposed on a substrate support and a front side facing away from the substrate support, directing a first radiation source from the backside of the first substrate to a first area covered by the patterned mask layer, directing a second radiation source from the backside of the first substrate to a second area uncovered by the patterned mask layer, collecting a first signal reflected from the first area covered by the patterned mask layer, collecting a second signal reflected from the second area uncovered by the patterned mask layer, and analyzing the combined first and the second signal.

20 Claims, 4 Drawing Sheets

(56) References Cited

U.S. PATENT DOCUMENTS

| | | |
|---|---|---|
| 5,835,677 A | 11/1998 | Li et al. |
| 5,855,680 A | 1/1999 | Soininen et al. |
| 5,866,795 A | 2/1999 | Wang et al. |
| 5,879,459 A | 3/1999 | Gadgil et al. |
| 5,916,365 A | 6/1999 | Sherman |
| 5,923,056 A | 7/1999 | Lee et al. |
| 6,015,590 A | 1/2000 | Suntola et al. |
| 6,015,917 A | 1/2000 | Bhandari et al. |
| 6,042,652 A | 3/2000 | Hyun et al. |
| 6,084,302 A | 7/2000 | Sandhu |
| 6,124,158 A | 9/2000 | Dautartas et al. |
| 6,139,700 A | 10/2000 | Kang et al. |
| 6,144,060 A | 11/2000 | Park et al. |
| 6,159,297 A | 12/2000 | Herchen et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,487 B1 | 3/2001 | Kim et al. |
| 6,231,672 B1 | 5/2001 | Choi et al. |
| 6,270,572 B1 | 8/2001 | Kim et al. |
| 6,284,646 B1 | 9/2001 | Leem |
| 6,287,965 B1 | 9/2001 | Kang et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,358,629 B1 | 3/2002 | Aga |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,447,607 B2 | 9/2002 | Soininen et al. |
| 6,451,119 B2 | 9/2002 | Sneh et al. |
| 6,451,695 B2 | 9/2002 | Sneh |
| 6,475,910 B1 | 11/2002 | Sneh |
| 6,476,276 B2 | 11/2002 | Matsui et al. |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,488,924 B1 | 12/2002 | Monteleone et al. |
| 6,511,539 B1 | 1/2003 | Raaijmakers |
| 6,551,406 B2 | 4/2003 | Kilpi |
| 6,749,974 B2 | 6/2004 | Chan |
| 7,771,895 B2 | 8/2010 | Wu et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0007790 A1 | 1/2002 | Park |
| 2002/0009544 A1 | 1/2002 | Mcfeely et al. |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0048635 A1 | 4/2002 | Kim et al. |
| 2002/0052097 A1 | 5/2002 | Park |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076837 A1 | 6/2002 | Hujanen et al. |
| 2002/0078508 A1 | 6/2002 | George |
| 2002/0082296 A1 | 6/2002 | Verschoor et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0134307 A1 | 9/2002 | Choi |
| 2002/0144655 A1 | 10/2002 | Chiang et al. |
| 2002/0144857 A1 | 10/2002 | Toyoda |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0197402 A1 | 12/2002 | Chiang et al. |
| 2003/0004723 A1 | 1/2003 | Chihara |
| 2003/0013320 A1 | 1/2003 | Kim et al. |
| 2003/0031807 A1 | 2/2003 | Elers et al. |
| 2003/0042630 A1 | 3/2003 | Babcoke et al. |
| 2003/0049942 A1 | 3/2003 | Haukka et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2008/0099436 A1* | 5/2008 | Grimbergen .................... 216/60 |

* cited by examiner

ETCH RATE DETECTION FOR PHOTOMASK ETCHING

CROSS-REFERENCE TO RELATED APPLICATIONS

This application claims benefit of U.S. Provisional Application Ser. No. 61/551,122 filed Oct. 25, 2011, which is incorporated by reference in their entirety.

BACKGROUND OF THE INVENTION

1. Field of the Invention

Embodiments of the present invention generally relate to the fabrication of integrated circuits and to the fabrication of photomasks useful in the manufacture of integrated circuits.

2. Description of the Related Art

The fabrication of microelectronics or integrated circuit devices typically involves a complicated process sequence requiring hundreds of individual steps performed on semiconductor, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif. The terms "mask", "photomask" or "reticle" will be used interchangeably to denote generally a substrate containing a pattern.

During processing, etch rate data from the etching of the photomasks may be used to determine whether the process is operating according to required specifications, and whether the desired results such as etch uniformity are achieved. Since each photomask generally has its own set of features or patterns, different photomasks being etched using the same process recipe may yield different etch rate data, thereby making it difficult to determine if the desired etch results are obtained for a specific photomask.

With ever-decreasing device dimensions, the design and fabrication of photomasks for advanced technology becomes increasingly complex, and control of critical dimensions and process uniformity becomes increasingly more important. Therefore, there is an ongoing need for improved process control in photomask fabrication, such as improved apparatus and methods for collecting etch rate data that would be consistent for each photomask.

SUMMARY OF THE INVENTION

The present invention provides a method and apparatus for etching a photomask substrate with enhanced process monitoring, for example, by providing for optical monitoring at different regions of the photomask to obtain desired etch rate or thickness loss. In one embodiment, the method includes etching a first substrate through a patterned mask layer in a plasma etch chamber, the first substrate having a backside disposed on a substrate support and a front side facing away from the substrate support, directing a first radiation source from the backside of the first substrate to a first area covered by the patterned mask layer, directing a second radiation source from the backside of the first substrate to a second area uncovered by the patterned mask layer, collecting a first signal reflected from the first area covered by the patterned mask layer, collecting a second signal reflected from the second area uncovered by the patterned mask layer, and analyzing the combined first and the second signal.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for etching a photomask substrate with enhanced process monitoring, for example, by providing for optical monitoring at different regions of the photomask to obtain desired etch rate or thickness loss. Although the discussions and illustrative examples focus on the etching rate detection during an etching process of a photomask substrate, various embodiments of the invention can also be adapted for process monitoring of other suitable substrates, including transparent or dielectric substrates, or optical disks.

Figure 1:
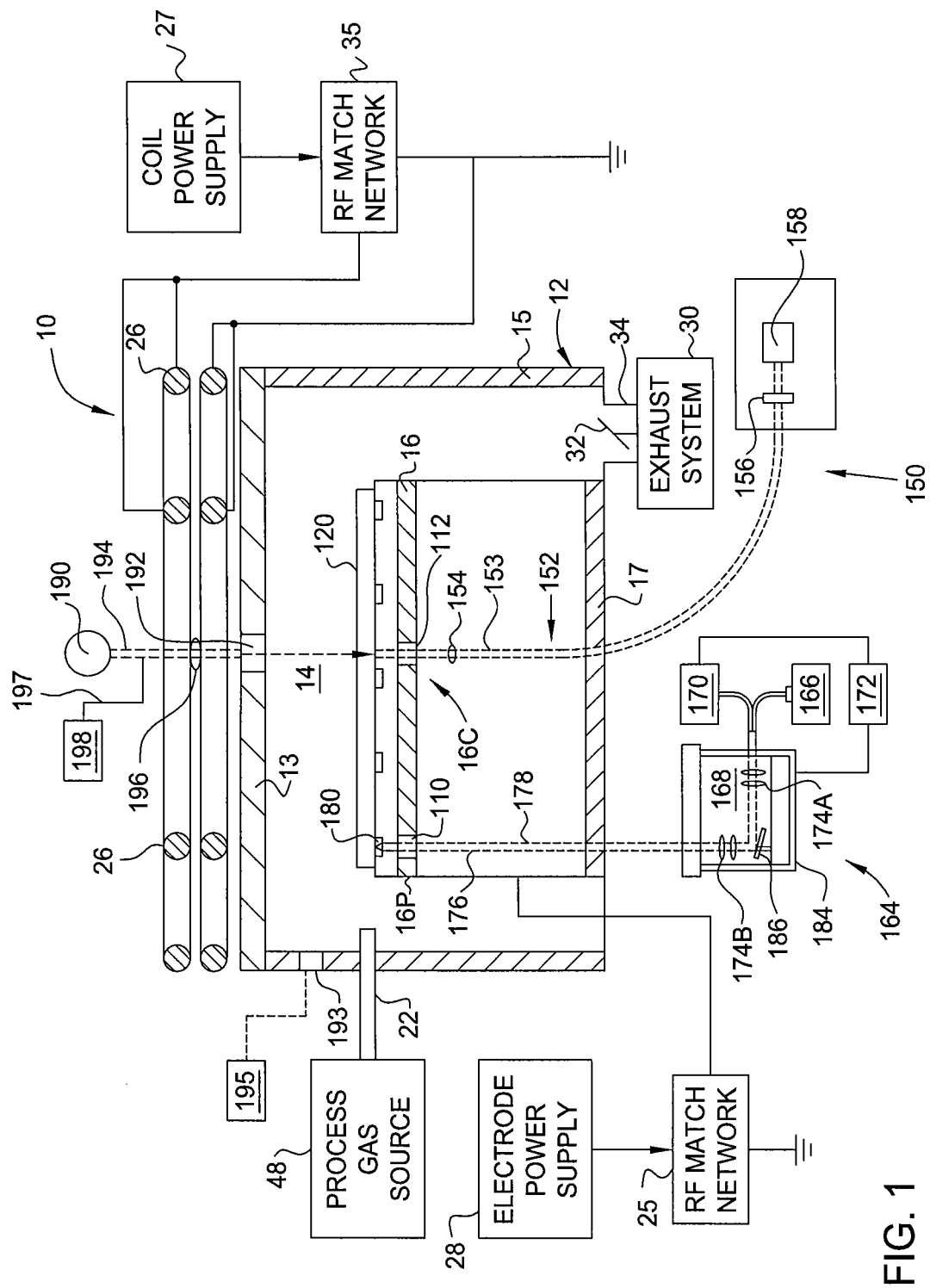
FIG. 1 illustrates a etch chamber incorporating one embodiment of the present invention.

FIG. 1 is a schematic cross sectional view of a plasma etch chamber 10 in accordance with one embodiment of the invention. Suitable plasma etch chambers that may be adapted to practice the invention include the Tetra™ II photomask etch chamber or the Decoupled Plasma Source (DPS™) chamber available from Applied Materials, Inc., of Santa Clara, Calif. Other suitably adapted process chambers may also be used in connection with embodiments of the invention, including, for example, capacitive coupled parallel plate chambers and magnetically enhanced ion etch chambers, as well as inductively coupled plasma etch chambers of different designs. The particular embodiment of the etch chamber 10 shown herein is provided for illustrative purposes and should not be used to limit the scope of the invention. It is contemplated that the invention may be utilized in other processing systems, including those from other manufacturers.

The etch chamber 10 generally includes a cylindrical sidewall or chamber body 12, an energy transparent ceiling 13 mounted on the body 12, and a chamber bottom 17. The ceiling 13 may be flat, rectangular, arcuate, conical, dome or multi-radius shaped. At least one inductive coil 26 is disposed above at least a portion of the ceiling 13. In the embodiment depicted in FIG. 1A, two concentric coils 26 are shown. The chamber body 12 and the chamber bottom 17 of the etch chamber 10 can be made of a metal, such as anodized aluminum, and the ceiling 13 can be made of an energy transparent material such as a ceramic or other dielectric material.

A substrate support member 16 is disposed in the etch chamber 10 to support a substrate 120 during processing. The support member 16 may be a conventional mechanical or electrostatic chuck with at least a portion of the support member 16 being electrically conductive and capable of serving as a process bias cathode. While not shown, a photomask adapter may be used to secure the photomask on the support member 16. The photomask adapter generally includes a lower portion configured to cover an upper portion of the support member and a top portion having an opening that is sized and shaped to hold a photomask. In one embodiment, the top portion of the photomask adapter has a square opening. A suitable photomask adapter is disclosed in U.S. Pat. No. 6,251,217, issued on Jun. 26, 2001, which is incorporated herein by reference.

Process gases are introduced into the etch chamber 10 from a process gas source 48 through a gas distributor 22 peripherally disposed about the support member 16 and/or disposed in the ceiling 13. Mass flow controllers (not shown) for each process gas, or alternatively, for mixtures of the process gas, are disposed between the etch chamber 10 and the process gas source 48 to regulate the respective flow rates of the process gases.

A plasma zone 14 is defined in the etch chamber 10 between the substrate support member 16 and the ceiling 13. A plasma is generated in the plasma zone 14 from the process gases by supplying power from a power supply 27 to the inductive coils 26 through an RF match network 35. The support member 16 may include an electrode disposed therein, which is powered by an electrode power supply 28 and generates a capacitive electric field in the etch chamber 10 through an RF match network 25. Typically, RF power is applied to the electrode in the support member 16 while the body 12 is electrically grounded. The capacitive electric field, which is transverse to the plane of the support member 16, influences the directionality of charged species to provide more anisotropic etching of the substrate 120.

Process gases and etchant byproducts are exhausted from the etch chamber 10 through an exhaust port 34 to an exhaust system 30. The exhaust port 34 may be disposed in the bottom 17 of the etch chamber 10 or may be disposed in the body 12 of the etch chamber 10 for removal of process gases. A throttle valve 32 is provided in the exhaust port 34 for controlling the pressure in the etch chamber 10.

In one embodiment, a detection system 164 operatively coupled to the etch chamber 10 for detecting etch rate and/or endpoint of the etching process. At least one optical access ports or viewports, are provided in different regions of the substrate support member 16. In the example shown in FIG. 1, the two optical access ports comprise respectively a window 110 at a peripheral region 16P, and a window 112 at a central region 16C. The detection system 164 is configured to detect optical signals through these windows, which allow optical monitoring of various locations on a photomask substrate 120 from its backside during etching. In one embodiment, a third window (not shown) may also be provided in the peripheral region 16P of the substrate support member 16. Alternatively, different numbers of windows may be provided at other locations of the substrate support member 16.

In general, a larger window facilitates the installation of optical components within the substrate support member 16. However, for apparatus in which the substrate support member 16 is RF biased, the size of the window, especially in the central region 16C of the substrate support member 16, is selected to be sufficiently large for optical monitoring, yet small enough to avoid potential adverse impact for the RF bias. Selecting a small window also improves the lateral temperature uniformity of the support member 16. The optical access port may generally comprise a flat window made of quartz or other materials that transmit light over a broad wavelength spectrum. A more detailed discussion of different optical configurations will be provided further below.

The detection system 164 comprises optical setup for operating in at least one of reflection, interferometry or transmission modes, and is configured for different types of measurements such as reflectance or transmittance, interferometry, or optical emission spectroscopy. Depending on the application of interest, e.g., the material layers or substrate structure being processed, endpoints may be detected based on a change in the reflectance or transmittance intensities, the number of interference fringes, or changes in optical emission intensities at specific wavelengths, or a combination thereof.

The reflection mode of operation allows reflectance (or reflectometry) and interferometric measurement to be performed. The detection system 164 generally comprises an optical light source 166, a focusing assembly 168 for focusing an incident optical beam 176 from the optical light source 166 onto a discreet area (e.g., spot) 180 on the backside of substrate 120, and a photodetector 170 for measuring the intensity of a reflected optical beam 178 reflected off the spot 180 of the substrate 120. The photodetector 170 may be a single wavelength or multi-wavelength detector, or a spectrometer. Based on the measured signal of the reflected optical beam 178, a computer system 172 calculates portions of the real-time waveform and compares it with a stored characteristic waveform pattern to extract information relating to the etch process. In one embodiment, the calculation may be based on slope changes or other characteristic changes in the detected signals, either in reflection or transmission mode, for example, when a film is etched to a target depth. Alternatively, the calculation may be based on interferometric signals as the depth of a trench or the thickness of a film changes during etching. In other embodiments, more detailed calculations may be performed based on interferometric signals obtained over a wide spectrum in order to determine the depth or thickness at any point in the etch process to determine etch rate of the object being etched.

The light source 166 may be monochromatic, polychromatic, white light, or other suitable light source. In general, the optical signal from the reflected optical beam 178 may be analyzed to extract information regarding the presence or absence of a layer (e.g., metal-containing layer), or the thickness of certain material layers within the spot 180. The intensity of the incident optical beam 176 is selected to be sufficiently high to provide a reflected optical beam 178 with a measurable intensity. The lamp can also be switched on and off to subtract background light such as from the plasma. In one embodiment, the light source 166 provides polychromatic light, e.g., from an Hg—Cd lamp, an arc lamp, or a light emitting diode (LED) or LED array, which generate light in wavelength ranges from about 170 nm to about 800 nm, or about 200 to 800 nm, for example about 250 nm to about 800 nm respectively. The polychromatic light source 166 can be filtered to provide an incident optical beam 176 having selected frequencies. Color filters can be placed in front of the photodetector 170 to filter out all wavelengths except for the desired wavelength of light, prior to measuring the intensity of the reflected optical beam 178 entering the photodetector 170. The light can be analyzed by a spectrometer (array detector with a wavelength-dispersive element) to provide data over a wide wavelength range, such as ultraviolet to visible, from about 200 nm to 800 nm. The light source 166 can also comprise a flash lamp, e.g., a Xe or other halogen lamp, or a monochromatic light source that provides optical emission at a selected wavelength, for example, a He-Ne or ND-YAG laser. The light source may be configured to operate in a continuous or pulsed mode. Alternatively, the wavelength range may be expanded into the deep UV as low as 170 nm or beyond y using optical materials with stable deep UV transmission and purging air paths with inert gas or other suitable carrier gas, such as nitrogen gas.

One or more convex focusing lenses 174A, 174B may be used to focus the incident optical beam 176 to the spot 180 on the substrate surface, and to focus the reflected optical beam 178 back on the active surface of photodetector 170. The spot 180 should be sufficiently large to compensate for variations in surface topography of the substrate 120 and device design features. This enables detection of etch endpoints for high aspect ratio features having small openings, such as vias or deep narrow trenches, which may be densely present or more isolated. The area of the return optical beam should be sufficiently large to activate a large portion of the active light-detecting surface of the photodetector 170. The incident and reflected optical beams 176, 178 are directed through a transparent window 110 in the etch chamber 10 that allows the optical beams to pass in and out of the processing environment.

The diameter of the beam spot 180 is generally about 2 mm to about 10 mm. However, if the beam spot 180 encompasses large isolated areas of the substrate containing only a small number of etched features, it may be necessary to use a larger beam spot in order to encompass a greater number of etched features. The size of the beam spot can therefore be optimized, depending on the design features for a particular device. If the signal is sufficient, a large beam spot or field of view will enable process control without precisely matching the position of the substrate support hole and the etched area of the substrate giving rise to the signal.

Optionally, an optical beam positioner 184 may be used to move the incident optical beam 176 across the substrate 120 to locate a suitable portion of the substrate surface on which to position the beam spot 180 to monitor an etching process. The optical beam positioner 184 may include one or more primary mirrors 186 that rotate at small angles to deflect the optical beam from the light source 166 onto different positions of the substrate surface. Additional secondary mirrors may be used (not shown) to direct the reflected optical beam 178 on the photodetector 170. The optical beam positioner 184 may also be used to scan the optical beam in a raster pattern across the backside of the substrate 120. In this embodiment, the optical beam positioner 184 comprises a scanning assembly consisting of a movable stage (not shown), upon which the light source 166, the focusing assembly 168 and the photodetector 170 are mounted. The movable stage can be moved through set intervals by a drive mechanism, such as a stepper motor or galvanometer, to scan the beam spot 180 across the substrate 120.

The photodetector 170 comprises a light-sensitive electronic component, such as a photovoltaic cell, photodiode, phototransistor, or photomultiplier, which provides a signal in response to a measured intensity of the reflected optical beam 178. The signal can be in the form of a change in the level of a current passing through an electrical component or a change in a voltage applied across an electrical component. The photodetector 170 can also comprise a spectrometer (array detector with a wavelength-dispersive element) to provide data over a wide wavelength range, such as ultraviolet to visible, from about 170 nm to 800 nm. The reflected optical beam 178 undergoes constructive and/or destructive interference which increases or decreases the intensity of the optical beam, and the photodetector 170 provides an electrical output signal in relation to the measured intensity of the reflected optical beam 178. The electrical output signal is plotted as a function of time to provide a spectrum having numerous waveform patterns corresponding to the varying intensity of the reflected optical beam 178.

A computer program on a computer system 172 analyzes the shape of the measured waveform pattern of the reflected optical beam 178 to determine the endpoint of the etching process. The waveform generally has a sinusoidal-like oscillating shape, with the trough of each wavelength occurring when the depth of the etched feature causes the return signal to be 180 degrees out of phase with the return signal reflected by the overlaying layer. The endpoint may be determined by calculating the etch rate using the measured waveform, phase information of the measured waveform and/or comparison of the measured waveform to a reference waveform. As such, the period of the interference signal may be used to calculate the depth and etch rate. The program may also operate on the measured waveform to detect a characteristic waveform, such as, an inflection point indicative of a phase difference between light reflected from different layers. The operations can be simple mathematic operations, such as evaluating a moving derivative to detect an inflection point.

Figure 2:
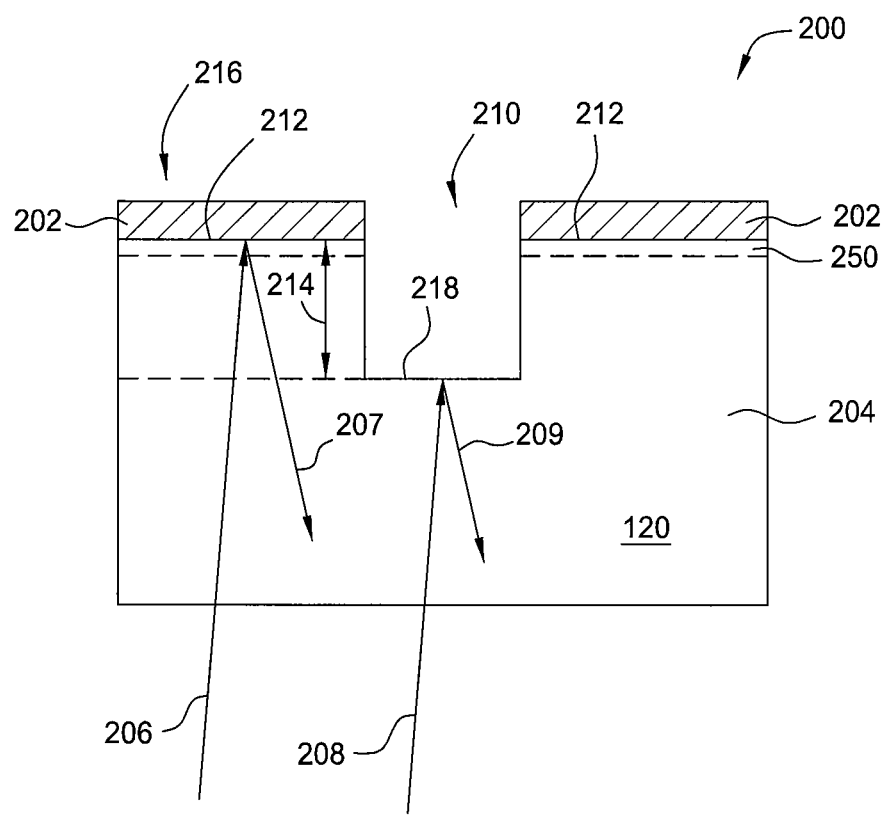
FIG. 2 illustrates schematically structures of one embodiment of the photomasks during fabrication.

FIG. 2 shows a binary photomask structure 200 with a patterned metal-containing layer 202 for etching a glass or a quartz layer 204 that may be monitored by different etch rate detection techniques of the present invention. Optionally, a photoresist layer (not shown) may be patterned and used as an etch mask disposed on the metal-containing layer 202.

In one embodiment, the patterned metal-containing layer 202 may be a chromium layer, or a composite layer including a chromium oxide disposed on chromium. Alternatively, a phase shifting material layer 250, e.g., molybdenum silicide (MoSi), may be optionally disposed between the metal-containing layer 202 and the quartz layer 204 as needed. The molybdenum silicide (MoSi) layer 250 may be etched with the patterned metal-containing layer 202 as a hardmask. The etch rate detection for etching the quartz layer 204 can be monitored either in reflection or transmission mode, and reflectance, transmittance and/or interferometric signals can be performed.

Halogen-containing gases are typically used for etching different materials found on the photomask structure 200. For example, a process gas containing chlorine may be used for etching a chromium layer, while a fluorine-containing gas such as trifluoromethane ($CHF_3$) or tetrafluoromethane ($CF_4$) may be used for etching quartz.

In the embodiment depicted in FIG. 2, a first incident optical beam 206 and a second incident optical beam 208 from the detection system 164 may be directed, through one of the windows in the substrate support member, onto one or more areas of the photomask substrate 120. The first incident optical beam 206 is configured to be directed to a first area 216 where the quartz layer 204 is protected and covered under the metal-containing layer 202. The second incident optical beam 208 is configured to be directed to a second area 210, such as open areas where the quartz layer 204 is exposed by the patterned metal-containing layer 202 to be etched to form trenches, vias, and apertures for the photomask structure 200 as needed. Alternatively, a large optical beam may be incident on both the patterned metal-containing layer 202 and the quartz layer 204 simultaneously, so that the open areas may be repeated to form a grating pattern. The beam would be large enough to cover as many as open areas as needed yet be small enough to be within a larger grating area.

A first return beam 207 and a second return beam 209, resulting from the interaction between the first and the second incident beam 206, 208 and the photomask structure 200, e.g., reflecting off the back surface of metal-containing layer 202 in the first area 216 (or interface 212 between the metal-containing layer 202 and the quartz layer 204) and reflecting off from the interface 218 where the quartz layer 204 being etched and exposed, is detected by the photodetector 170 of the detection system 164. The interface 212 causes a phase change in the reflected beam 207. In the case of a quartz/chromium interface 212, the phase change is approximately 115 degrees. The interface 218 of quartz to vacuum causes a phase change of about zero degrees. During etching of the quartz layer 204, the intensity of the reflected optical beam 209 remains constant, as does the optical beam 207. However, as the thickness of the quartz layer 204 shrinks due to etching, the phase of the reflected beam 209 relative to the phase of the reflected beam 207 changes over time. The vector sum of these two produces the interferometric signal. The time-varying sum at a particular wavelength as well as the reflection section obtained from these two different areas may be analyzed to determine at least one of the depth etched, the etch rate and the end point of the quartz etching process.

Figure 3:
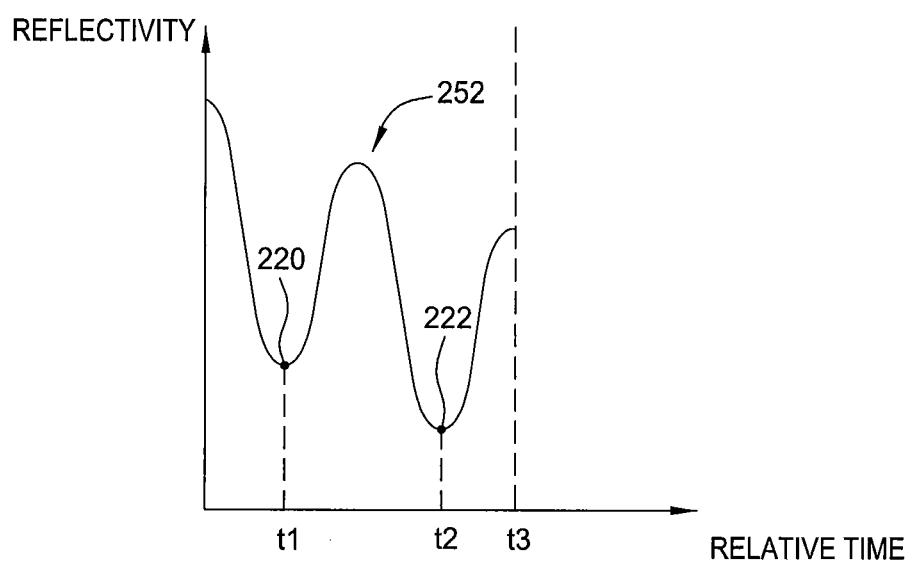
FIG. 3 illustrates one embodiment of optical signals detected for etch rate determination.

FIG. 3 depicts one embodiment of optical signals as detected for etch rate determination at a light wavelength at about 230 nm from the light source 166. The summation optical signal 252, as shown in FIG. 3, is plotted as a function of time to provide a waveform pattern corresponding to the varying intensity of a sum of the reflected optical beam 207, 209. The waveform pattern will be different at other wavelengths. Collecting a spectrum of wavelengths will provide numerous waveform patterns. The optical signal 252 is detected real-time when a production substrate is etched into the processing chamber. In the embodiment depicted in FIG. 3, the detected optical signal 252 is a sum of the signal detected from the first optical beam 207 and the second optical beam 209. As the signal from beam 209 will be periodically out of phase with the signal from beam 207 as the depth of the etch feature increases, the summation signal 252 will be a periodic wave form. In one embodiment, the thickness loss (etch depth 214, as depicted in FIG. 2) of the quartz layer 204 during the etching process may be obtained by calculating the number of fringes (f) present in the optical signal 252. Each fringes (f) is equal to one wavelength (e.g., period) of the optical signal 252 arising from optical interferences between different portion of detected optical signal 252 that travels through different thickness of the quartz layer 204. Since the trough of the optical signal 252 only occurs when the depth or change in thickness etch results in 180 degree out of phase signal which is an known distance, the total distance etched is equal to the number of fringes (f) (including fraction thereof) times the depth which produces an 180 degree out of phase signal for the particular material being etched. Since interferences between the two reflected areas 216, 210 produce interferences fringes that are indicative of the thickness difference in quartz layer 204 traversed by these areas 216, 210, the etch depth 214 can be obtained by monitoring the interference fringes in the reflected beam. The etch depth 214 (D) or etching rate (E) of the quartz layer 204 may be calculated and obtained by the following equation, wherein f represents the number of the fringes and n represents the refractive index of the material being etched.

$$\text{Depth}(D) = f\lambda/(2n)$$

In the embodiment depicted here, as the material being etched is quartz, the refractive index of quartz is between about 1.54-1.56 under a light source at wavelength about 230 nm, varied by different manufacture process. In one embodiment, the refractive index of the quartz layer 204 as depicted here is about 1.54.

In the embodiment depicted in FIG. 3, by monitoring the number of the fringes detected in the detected optical signal 252, the depth (D) of thickness of the quartz layer 204 may be calculated by using the equation above, since the wavelength of the light source and the refractive index are both known factors in the equation. For example, as the spectrum depicted in the optical signal 252 indicates a total of two fringes is monitored, the depth (D) of the quartz layer thickness boss is calculated to be about 150 nm (e.g., 2×230 nm/2×1.55=~150 nm).

Alternatively, it can also be calculated by the following equation.

$$\text{Etch Rate}(E) = \lambda/(2n)/(t_2 - t_1)$$

and $$\text{Total time } (t_{endpoint}) = \text{Depth}(D_{endpoint})/\text{Etch Rate }(E)$$

As the example depicted in FIG. 3, the detected optical signal 252 indicates that a fringe is observed between a first trough 220 and a second trough 222. The first trough 220 is occurred at a first time point $t_1$ and the second trough 222 is occurred at a second time point $t_2$. Accordingly, the time period by subtraction of the first time point $t_1$ and the second time point $t_2$ ($t_2 - t_1$) represents the time period required for obtaining one fringe. Therefore, by calculating the etch rate over one or more fringes, the total process time, e.g., the process end point or (Total time ($t_{endpoint}$)), required to reach a target etch depth (Depth ($D_{endpoint}$)) may be calculated and utilized to determine the end point of the substrate being etched or for subsequent substrates having the same film stack. In the example of FIG. 3, Total time ($t_{endpoint}$)=$t_3$.

In another embodiment, the endpoint may be determined by counting the number of fringes (f) to determine when the etch depth is less than a predetermined depth (for example, just less than the target depth), then etching the last portion of the layer using the etch rate calculated using one or more wavelengths in the spectrum. Since the fringes (f) are accurate indicators of a known depth, using the etch rate to etch the final portion of the layer minimizes potential error. Combining etch rates determined at different wavelengths can yield improved accuracy.

The accuracy of the method described above and the methods described below may be improved by utilizing a metric indicative of etching within the chamber. For example, a sensor or other device may be utilized to determine when the plasma is ignited within the chamber or when etched material is present in the plasma and/or chamber exhaust. This information may be utilized to commence counting of the time $t_3$ to that the endpoint is determined during the time of actual etching, and not during the time in which gases and/or power is provided to the chamber but physical etching of the substrate has not begun.

Figure 4A:
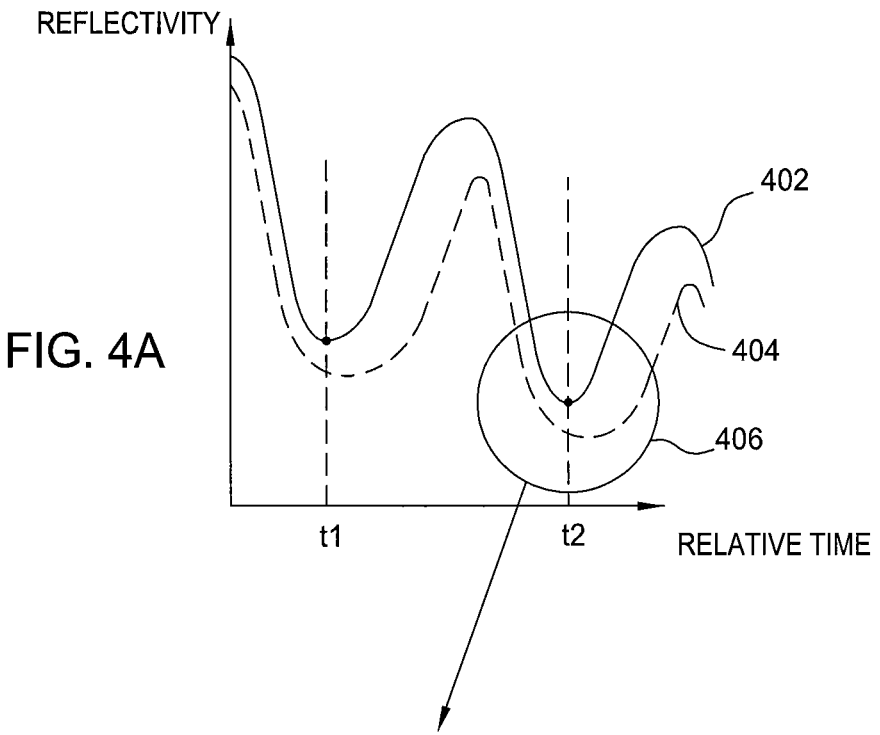
FIGS. 4A-4B illustrate another embodiment of optical signals detected for etch rate determination.
Figure 4B:
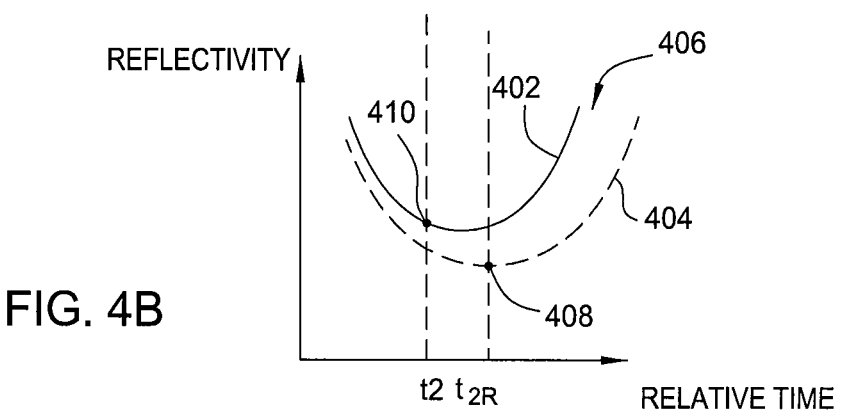

FIGS. 4A-4B illustrate another embodiment of optical signals as detected plotted as a function of time for etch rate determination at a light wavelength at about 230 nm from the light source 166. In contrast with the real-time spectrum monitoring technique illustrated in FIG. 3, a reference substrate is processed to collect a reference waveform 404 for comparison with a production substrate real-time monitored waveform 402. The reference waveform 404 may be obtained during etching a reference substrate having structures similar to the structures formed on a production substrate, such as the substrate depicted in FIG. 2. The optical signal obtained during etching of the reference substrate is collected to generate the waveform 404 (shown in dotted line in FIG. 4A and 4B). After obtaining the reference waveform 404, a reference etch rate ($E_R$), endpoint (Total time ($t_{endpoint}$)) and/or referenced feature depth ($D_R$) in the quartz layer on the reference substrate may be obtained and calculated using the method described above with referenced to FIG. 3. Alternatively, the reference feature depth ($D_R$) in the quartz layer formed on the reference substrate may also be obtained using a suitable measurement tool as needed. Generally, the process time required to reach a target depth $D_T$ on the production substrate may be determined using the reference substrate waveform 402 and the techniques described above or other suitable technique. For example, the reference etch rate ($E_R$), and/or endpoint (Total time ($t_{endpoint}$)) determined using the reference substrate may be used to etch the production substrate.

The differences between the reference substrate waveform 402 and the production substrate waveform 402 may be utilized to improve the accuracy of the endpoint determination. For example, the production substrate real-time waveform 402 is compared with the reference substrate waveform 404 to determine the difference or offset in time when the trough is reached for each waveform 402, 404. If the troughs are reached at different times, this is indicative of the production substrate etching at a different rate than the reference substrate. As shown in the exploded view of the waveforms 402, 404 around a second trough 408 depicted in FIG. 4B, the second trough 408 of the production substrate spectrum 412 occurs at the second time point $t_{2R}$ and the second trough 408 of the production substrate spectrum 410 occurs at the second time point $t_2$. Since $t_1$ and $t_{2R}$ occur at the bottom of the waveform, the etched depth is the same. Therefore, after comparing the two waveforms 402, 404, a process time difference ($t_{2R} - t_2$) may be obtained by subtracting the total reference substrate process time $t_{2R}$ with the production substrate process time $t_2$. Accordingly, the end point Total time ($t_{endpoint}$) utilized may be adjusted by the time difference ($t_{2R} - t_2$) to determine the different in time to reach a predetermined depth if the production substrate is etched at a rate different than the reference substrate. Then, the additional (or less) time needed to reach the target depth on the production substrate may be calculated using the production substrate etch rate calculated as described above divided by the additional distance needed to reach the target depth. For example, in the embodiment depicted in FIG. 4B, as the process time for $t_2$ for the production substrate to reach the bottom of trough 410 shown in waveform 402 is about ($t_{2R} - t_2$) shorter than the process time $t_{2R}$ for the referenced substrate to reach the bottom of the trough 408. Since the bottom of each trough 408, 410 is indicative of a known etch depth (which can be calculated as described above), the production substrate would be over-etched if etched for the period determined using the reference substrate. Thus, the endpoint of the production substrate may be determined in multiple ways. In one embodiment, the endpoint of the production substrate etch may be determined by subtracting the ($t_{2R} - t_2$) from the total etch end time determined by etching the production substrate. In another embodiment, the end point of the production substrate may be determined using the production substrate etch rate determined as described above, and etching beyond the time $t_2$ for a period equal to the etch rate of the production substrate divided by the difference between the target depth and depth at the bottom of the trough 408. In yet another embodiment, the endpoint of the production substrate may be determined using the production substrate etch rate determined as described above, and etching beyond the time $t_2$ for a period equal to the etch rate of the production substrate divided by the difference between the target depth and the depth at the bottom of the trough 408.

Figure 5A:
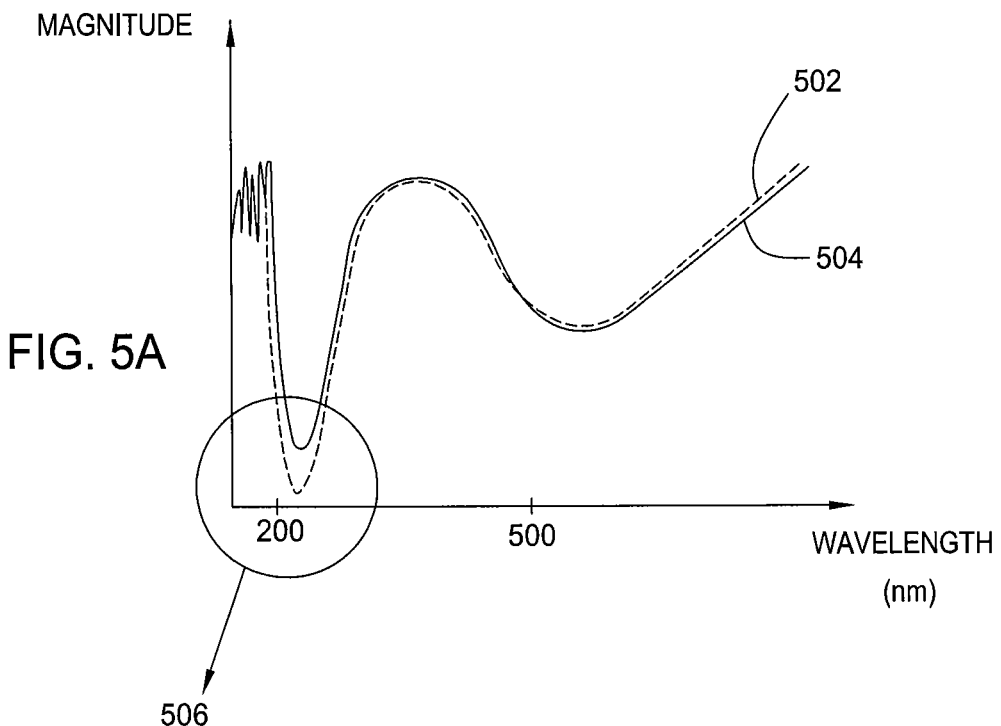
FIGS. 5A-5B illustrate yet another embodiment of optical signals detected for etch rate determination.
Figure 5B:
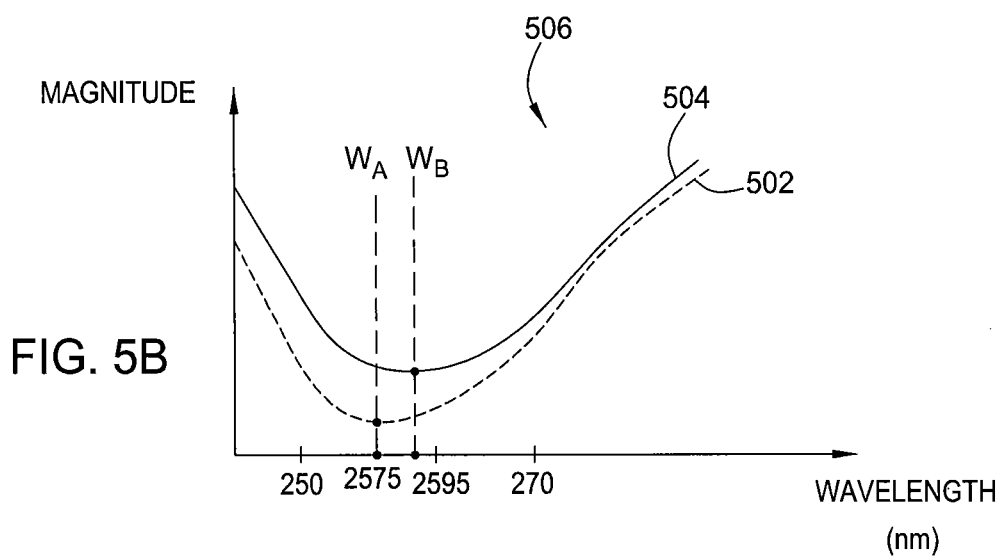

FIGS. 5A-5B illustrate another embodiment of optical signals as detected for etch rate determination by monitoring reflection spectra of the substrates during etching process. Similar to the method discussed above with referenced to FIGS. 4A-4B, a referenced substrate is processed to collect a referenced reflection spectrum 502 for comparison with a product substrate reflection spectrum 504. The reference reflection spectrum 502 may be obtained by etching a referenced substrate having structures similar to the structures formed on a production substrate, such as the substrate depicted in FIG. 2. The optical signal is collected to provide a spectrum 502 (shown by dotted line 502 in FIG. 5A and 5B) during etching of the referenced substrate. After obtaining the reference spectrum 502, the referenced etching rate ($E_R$), Total time ($t_{endpoint}$), and/or reference thickness depth ($D_R$) of the quartz layer on the reference substrate may be obtained and calculated by using the method described above with referenced to FIG. 3. Alternatively, the referenced thickness depth ($D_R$) of the quartz layer lost on the referenced substrate may also be obtained or confirmed by any suitable measurement tool as needed to obtain the absolute loss of thickness depth ($D_R$) during the etching process.

Subsequently, the production substrate reflection spectrum 504 may be obtained by transferring a production substrate into the etching chamber using the similar manner discussed above with referenced to FIG. 2 to obtain the production substrate reflection spectrum 504. The production substrate reflection spectrum 504 is then compared to the reference substrate reflection spectrum 502 so as to calculate and obtain the etch rate/loss of thickness depth (D) of a quartz layer disposed on the production substrate.

In one embodiment, the minima and maxima in reflection spectrum 504 can be used to determine loss of thickness depth (D) by comparing the minimum wavelength shifts during etching process in accordance with the referenced spectrum 502 of the referenced substrate. As shown in the magnified view of FIG. 5B, the minimum reflection intensity 506 as detected from the reflection spectrum 502, 504 of the referenced substrate and the production substrate is magnified. The minimum intensity of production substrate reflection spectrum 504 is found at point $W_B$ at around wavelength of 259.5 nm while the minimum reflection intensity of the referenced substrate reflection spectrum 502 is found at $W_A$ at about 257.5 nm. Thus, according to what the spectra 502, 504 indicate, the difference of the minimum reflective intensity between the referenced substrate and the product substrate is about 2 nm (e.g., 259.5 nm−257.5 nm=2 nm). Accordingly, the loss of the thickness depth (D) is predicted to be 2 nm larger than the referenced substrate since the minimum reflection intensity of the production substrate is about 2 nm larger than the minimum reflection intensity of the referenced substrate. Furthermore, the production substrate is then transferred to a measurement tool to perform the actual loss of thickness depth (D) measurement for verification. It turned out that the loss of thickness depth (D) of the production substrate is about 2.4 nm deeper than the loss of the thickness depth ($D_R$), which is very close to the number, about 2 nm, as predicted by the comparison of the minimum reflection intensity between the referenced substrate and the production substrate, as depicted in FIG. 5B. According, it may be concluded that the loss of the thickness depth (D)/etch rate of the production substrate may be calculated and obtained by comparison of the minimum reflection intensify between the referenced substrate and the production substrate as discussed above within a reasonable and acceptable tolerance range.

Furthermore, based on the calculation and prediction of the etch rate/loss of thickness of the quartz layer using the methods discussed above, the process parameters may be real-time adjusted using in-line statistical process control (in-line SPC) for optimization of the process.

By applying one or more optical light source measurement techniques for simultaneous monitoring at different locations of the substrate, embodiments of the present invention provide an improved apparatus and method with enhanced process monitoring and control capabilities. These improvements also allow reliable etch rate/loss of thickness for photomask etching applications.

While the foregoing is directed to embodiments of the present invention, other and further embodiments of the invention may be devised without departing from the basic scope thereof, and the scope thereof is determined by the claims that follow.

The invention claimed is:

1. A method of determining a thickness loss of a layer disposed on a substrate during an etching process, comprising:
   etching a first substrate through a patterned mask layer in a plasma etch chamber, the first substrate having a backside disposed on a substrate support and a front side facing away from the substrate support;
   directing a first radiation source from the backside of the first substrate to a first area covered by the patterned mask layer;
   directing a second radiation source from the backside of the first substrate to a second area uncovered by the patterned mask layer;
   collecting a first signal reflected from the first area covered by the patterned mask layer;
   collecting a second signal reflected from the second area uncovered by the patterned mask layer; and
   analyzing the combined first and the second signal.

2. The method of claim 1, wherein the first substrate is a photomask reticle.

3. The method of claim 1, wherein etching the first substrate further comprises etching quartz.

4. The method of claim 1, wherein the first and the second radiation source has a wavelength between about 170 nm and about 800 nm.

5. The method of claim 1, wherein analyzing the combined first and the second signal further comprises:
   obtaining a first spectrum in a reflective form plotted as a function of time from the combined first and the second signal.

6. The method of claim 5, further comprising:
   analyzing waveforms from the spectrum to determine a number of fringes occurred in the spectrum in a predetermined time period.

7. The method of claim 6, further comprising:
   determining a first thickness loss of the first substrate during the etching process.

8. The method of claim 5, further comprising:
   etching a second substrate having a second patterned mask layer disposed thereon in the plasma etch chamber;
   directing a third radiation source from a backside of the second substrate to a third area covered by the second patterned mask layer;
   directing a fourth radiation source from the backside of the second substrate to a fourth area uncovered by the second patterned mask layer;
   collecting a third signal reflected from the third area covered by the second patterned mask layer;
   collecting a fourth signal reflected from the fourth area uncovered by the second patterned mask layer; and
   analyzing the combined third and fourth signal.

9. The method of claim 8, wherein analyzing the combined third and fourth signal further comprises:
   obtaining a second spectrum in a reflective form plotted as a function of time from the combined third and fourth signals.

10. The method of claim 9, further comprising:
    comparing waveforms from the second spectrum with the waveforms from the first spectrum to determine a shift of fringes in time.

11. The method of claim 10, further comprising:
    calculating a thickness difference during etching of the second substrate to determine a second thickness loss occurred on the second substrate.

12. The method of claim 1 claim 8, further comprising:
    etching a third substrate having a third patterned mask layer disposed thereon in the plasma etch chamber;
    directing a fifth radiation source from a backside of the third substrate to a fifth area covered by the third patterned mask layer;
    directing a sixth radiation source from the backside of the third substrate to a sixth area uncovered by the third patterned mask layer;
    collecting a fifth signal reflected from the fifth area covered by the third patterned mask layer;
    collecting a sixth signal reflected from the sixth area uncovered by the third patterned mask layer; and
    analyzing the combined fifth and sixth signal.

13. The method of claim 12, wherein analyzing the combined fifth and sixth signal further comprises:
    obtaining a third spectrum at different wavelength shown in signal magnitude.

14. The method of claim 13, further comprising:
    comparing the third spectrum with a first spectrum obtained from the combined first and the second signal; and determining a wavelength shift between the third spectrum and the first spectrum.

15. The method of claim 14, further comprising:
determining a thickness loss difference between the first and the third substrates after the etching process.

16. The method of claim 1, wherein each of the first and second signals is one of reflectance, transmittance, interferometric signal, or optical emission signal.

17. The method of claim 1, further comprising:
determining a process endpoint based on the combined first and the second signal.

18. The method of claim 1, wherein the patterned mask layer is a Cr containing layer.

19. The method of claim 1, wherein a phase shift layer is disposed between the patterned mask layer and the substrate.

20. The method of claim 19, wherein the phase shift layer is a MoSi layer.

* * * * *

UNITED STATES PATENT AND TRADEMARK OFFICE
CERTIFICATE OF CORRECTION

| | |
|---|---|
| PATENT NO. | : 8,961,804 B2 |
| APPLICATION NO. | : 13/650930 |
| DATED | : February 24, 2015 |
| INVENTOR(S) | : Michael N. Grimbergen |

It is certified that error appears in the above-identified patent and that said Letters Patent is hereby corrected as shown below:

In the Claims:

Column 12, Line 46, Claim 12, please delete "claim 1".

Signed and Sealed this
Fourteenth Day of July, 2015

Michelle K. Lee
*Director of the United States Patent and Trademark Office*